(12) United States Patent
Sarig et al.

(10) Patent No.: US 7,737,390 B2
(45) Date of Patent: Jun. 15, 2010

(54) HORIZONTAL ROW DRIVERS FOR CMOS IMAGE SENSOR WITH TILING ON THREE EDGES

(75) Inventors: Erez Sarig, Midgal Haemek (IL); Raz Reshef, Midgal Haemek (IL); Shay Alfassi, Midgal Haemek (IL); David Cohen, Midgal Haemek (IL)

(73) Assignee: Tower Semiconductor, Ltd., Migdal Haemek (IL)

( * ) Notice: Subject to any disclaimer, the term of this patent is extended or adjusted under 35 U.S.C. 154(b) by 0 days.

(21) Appl. No.: 12/014,070

(22) Filed: Jan. 14, 2008

(65) Prior Publication Data

US 2009/0179141 A1    Jul. 16, 2009

(51) Int. Cl.
*H01L 27/00* (2006.01)
*H04N 9/083* (2006.01)
(52) U.S. Cl. .................. 250/208.1; 348/281
(58) Field of Classification Search .............. 250/208.1; 348/308, 281
See application file for complete search history.

(56) References Cited

U.S. PATENT DOCUMENTS

| | | | |
|---|---|---|---|
| 5,739,562 A * | 4/1998 | Ackland et al. ............. 257/291 |
| 6,204,506 B1 * | 3/2001 | Akahori et al. ........ 250/370.09 |
| 6,225,013 B1 | 5/2001 | Cohen et al. |
| 6,238,939 B1 | 5/2001 | Wachs et al. |
| 6,906,332 B2 | 6/2005 | Tashiro et al. |
| 7,009,646 B1 | 3/2006 | Fossum et al. |
| 7,019,302 B2 * | 3/2006 | Takabayashi et al. .. 250/370.11 |
| 2008/0121808 A1 * | 5/2008 | Roizin et al. ........... 250/370.11 |

* cited by examiner

*Primary Examiner*—Thanh X Luu
(74) *Attorney, Agent, or Firm*—Bever, Hoffman & Harms, LLP; E. Eric Hoffman

(57) ABSTRACT

A large image sensor structure is created by tiling a plurality of image sensor dies, wherein each of the image sensor dies includes a pixel array that extends to three edges of the die, and control circuitry located along a fourth edge of the die. None of the control circuitry required to access the pixel array (e.g., none of the row driver circuitry) is located in the pixel array, thereby enabling consistent spacing of pixels across the pixel array. Because the pixel array of each image sensor die extends to three edges of the die, the pixel array of each image sensor die can abut up to three pixel arrays in other image sensor dies to form a large image sensor structure having 2×N tiled image sensor dies.

16 Claims, 4 Drawing Sheets

US 7,737,390 B2

HORIZONTAL ROW DRIVERS FOR CMOS IMAGE SENSOR WITH TILING ON THREE EDGES

FIELD OF THE INVENTION

The present invention relates to large CMOS image sensors that created by tiling a plurality of CMOS image sensor dies.

RELATED ART

Some digital imaging applications, such as fluoroscopy or angioscopy, require the use of large digital image sensors. In order to implement large digital image sensors using CMOS imaging technology, multiple CMOS image sensors must be tiled (i.e., mounted adjacent to one another in an array configuration).

U.S. Pat. No. 7,009,646 to Fossum et al. describes a three-sided buttable CMOS image sensor chip, which can be tiled to create a large digital image sensor. However, Fossum et al. require that the image sensor area of each chip include a centralized row-local control portion, which runs up the center of the image sensor area, such that the central two pixels of each image sensor chip are masked (i.e., missing). Fossum et al. further require a two pixel interpolator to interpolate for the missing pixels along the central area of each image sensor chip.

U.S. Pat. No. 6,906,332 to Tashiro et al. describes an image sensing system which places rows of control logic and serial readout logic in predetermined spaces between array pixels. Including this logic in the pixel array undesirably reduces the fill factor of the resulting image sensor.

It would therefore be desirable to have a CMOS image sensor die that can be tiled along three edges, and does not require control logic to be interspersed within the pixel array.

SUMMARY

Accordingly, the present invention provides a CMOS image sensor die having a pixel array that extends to three edges of the die. All control circuitry, including row driver circuitry, is located along a fourth edge of the die. None of the control circuitry required to access the pixel array is located within the pixel array, thereby providing an improved fill factor and eliminating the need for pixel interpolation within the pixel array. The present invention thereby provides improved pixel sensitivity without losing image resolution, and enables consistent spacing of pixels throughout the pixel array.

In accordance with one embodiment, multiple CMOS image sensor dies can be tiled to create a large CMOS image sensor structure. Because the pixel array of each CMOS image sensor die extends to three edges of the die, the pixel array of each CMOS image sensor die can abut up to three pixel arrays in up to three other image sensor dies. In accordance with one embodiment, a large CMOS image sensor structure can be created by tiling two rows×N columns of CMOS image sensor dies. In the first row of CMOS image sensor dies, the control circuitry of each die is located along an upper edge of the row. In the second row of CMOS image sensor dies, the control circuitry of each die is located along a lower edge of the row. As a result, the control circuitry of each of the CMOS image sensor dies is located along an outer edge of the tiled structure.

The present invention will be more fully understood in view of the following description and drawings.

DETAILED DESCRIPTION

Figure 1:
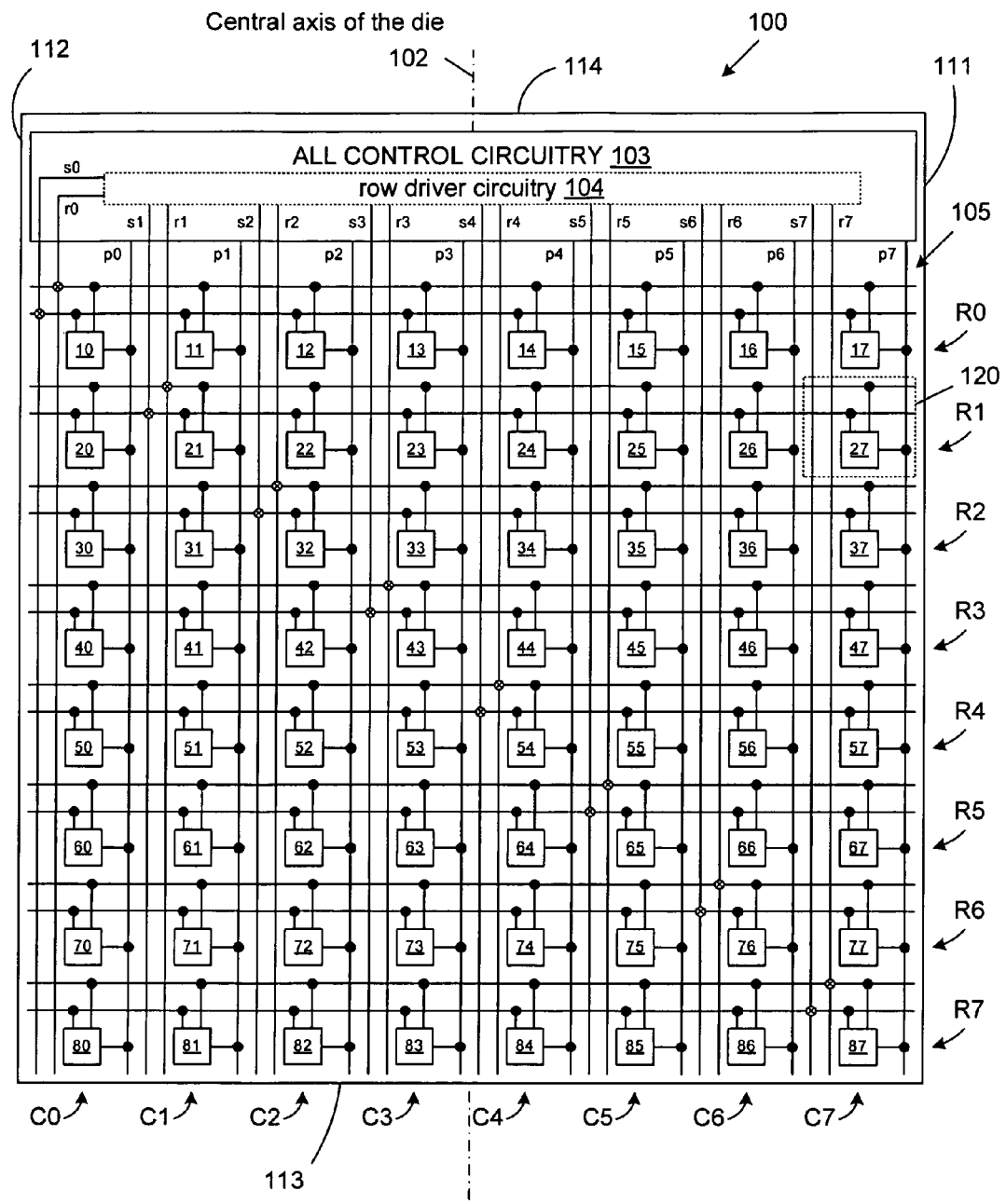
FIG. 1 is a block diagram of an image sensor die in accordance with one embodiment of the present invention.

FIG. 1 is a block diagram of a CMOS image sensor die 100 in accordance with one embodiment of the present invention. As used, herein, the term 'die' refers to a continuous substrate on which a pixel array and the associated control circuitry is fabricated. A die can have various shapes and sizes, and is not necessarily limited by the exposure area of a reticle used in the corresponding photolithographic process. That is, a die can be made larger than the reticle exposure area of a photolithographic process by implementing a conventional stitching process. This relationship is illustrated in FIG. 2.

Figure 2:
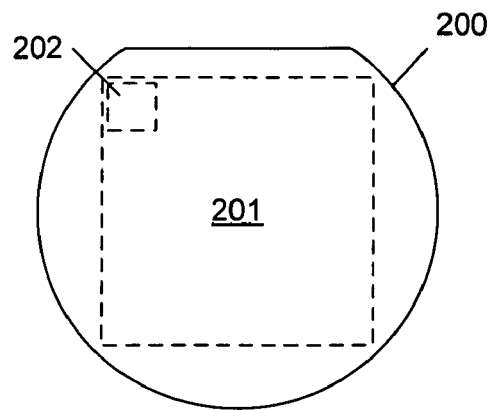
FIG. 2 is a schematic view of a conventional semiconductor wafer, which illustrates a maximum reticle exposure area and a possible size of an image sensor die in accordance with one embodiment of the present invention.

FIG. 2 is a schematic view of a conventional semiconductor wafer 200, wherein region 202 represents the maximum exposure area of a reticle used in a photolithographic system used to process wafer 200. Typically, one or more entire dies may be fabricated within region 202. However, multiple reticle exposure areas can be 'stitched' together to create larger die sizes. For example, a single die can be fabricated within region 201 of wafer 200 by stitching the exposure areas of multiple reticles. Conventional stitching processes are described in more detail in U.S. Pat. Nos. 6,238,939 and 6,225,013. Wafer 200 is sawn (or otherwise cut) along the borders of the die (e.g., along the edges of region 201) to separate the die from the rest of the wafer.

In the described embodiments, image sensor die 100 has a rectangular shape to facilitate the tiling of this die with other similar dies. However, in other embodiments, image sensor die 100 can have other shapes.

Returning now to FIG. 1, CMOS image sensor die 100 includes control circuitry 103 and CMOS pixel array 105. In the described embodiments, image sensor die 100 includes a semiconductor (e.g., monocrystalline silicon) substrate that is processed using a conventional CMOS process. Pixel array 105 includes a plurality of conventional CMOS pixels 10-17, 20-27, 30-37, 40-47, 50-57, 60-67, 70-77 and 80-87, which are arranged in rows R0-R7 and columns C0-C7, as illustrated. Although pixel array 105 is illustrated as an 8×8 array of pixels, it is understood that pixel array 105 will typically be much larger in practical applications. One of ordinary skill in the art would readily understand how to expand pixel array 105 in view of the following disclosure.

In the described embodiments, each of the CMOS pixels includes a reset terminal, a select terminal and a pixel signal terminal. The reset terminal receives a reset signal, which is activated to restore a predetermined reference charge level to a photodiode of the pixel. The select terminal receives a select signal, which is activated to enable a pixel signal voltage representative of the charge level of the photodiode to be provided (read out) to the pixel signal terminal. A row driver circuit 104 within the control circuitry 103 generates the reset and select signals used to operate the pixel array 105.

More specifically, row driver circuit 104 generates reset and select signals to access pixel array 105 on a row-by-row basis. Thus, row driver circuit 104 generates a reset signal $r_N$ and a select signal $s_N$ for each row $R_N$ of pixel array 105. Each reset signal $r_N$ and select signal $s_N$ is routed from the row driver circuit 104 to the pixels of the corresponding row $R_N$ by dedicated conductive interconnect circuitry (i.e., metal interconnect lines). Note that no portion of the row driver circuit 104 (and none of the control circuitry 103) is located within pixel array 105. Rather, the entire row driver circuit 104 (and all of the control circuitry 103) is located outside of pixel array 105, along an edge 114 of image sensor die 100. In the described embodiment, the row driver circuit 104 (and the control circuitry 103) is located along an edge of the die 100 that extends in parallel with the rows $R_0$-$R_7$ of the pixel array 105.

The pixel signal terminals of the pixels in a column ($C_M$) of pixel array 105 are commonly coupled to a corresponding pixel signal line ($p_M$). Each of the pixel signal lines $p_M$ is implemented by dedicated conductive interconnect circuitry (i.e., metal interconnect lines). The pixel signal lines p0-p7 route the pixel signal voltages from pixels in an accessed row of the pixel array 105 to control circuitry 103. Although the present invention is described in connection with a specific pixel type that is accessed by specific control signals, it is understood that the present invention can be applied to other pixel types, which may be accessed in response to other control signals.

Pixel array 105 extends to three edges 111, 112 and 113 of image sensor die 100 as illustrated. As described below, this configuration enables image sensor die 100 to be tiled with similar image sensor dies along edges 111, 112 and 113. An insulating guard ring (not shown) may be located at the edges of image sensor die 100. This guard ring ensures a minimum separation between pixel array 105 and the physical edges of image sensor die 100. In the described embodiments, the guard ring has a width of about 25 microns.

In accordance with the embodiment illustrated by FIG. 1, each of the pixels in pixel array 105 has a substantially identical layout, including the layout of the interconnect structure.

Figure 3:
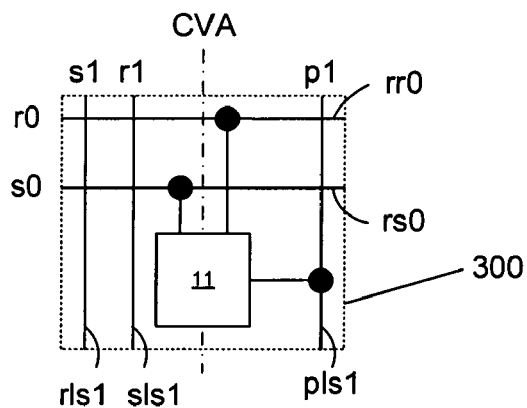
FIG. 3 and FIG. 4 are block diagrams illustrating layouts associated with pixels of an image sensor die in accordance with one embodiment of the present invention.

FIG. 3 is a block diagram illustrating the layout 300 associated with pixel 11. In addition to the pixel circuit 11, this layout 300 includes a row reset line segment rr0 and a row select line segment rs0, which transmit the reset signal r0 and the select signal s0, respectively, to pixel 11. Layout 300 also includes a pixel line segment p1s1, which forms a portion of pixel signal line p1. Finally, layout 300 includes a reset line segment r1s1 and a select line segment s1s1, which transmit the reset signal r1 and the select signal s1, respectively, to pixels 20-27 of row R1. Note that reset line segment r1s1 and a select line segment s1s1 pass through layout 300 without connecting to any other structure within layout 300. Within pixel array 105, pixels 11-17, 20, 22-27, 30-31, 33-37, 40-42, 44-47, 50-53, 55-57, 60-64, 66-67, 70-75, 77 and 80-86, have the same layout 300 illustrated by FIG. 3.

Figure 4:
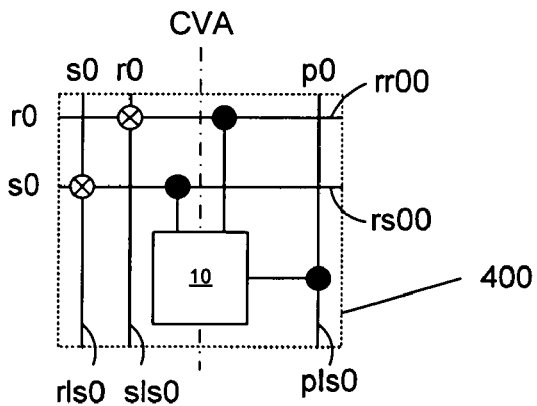

FIG. 4 is a block diagram illustrating the layout 400 associated with pixel 10. In addition to the pixel circuit 10, this layout 400 includes a row reset line segment rr0 and a row select line segment rs00, which transmit the reset signal r0 and the select signal s0, respectively, to pixel 10. Layout 400 also includes a pixel line segment p1s0 which forms a portion of pixel signal line p0. Finally, layout 400 includes a reset line segment r1s0 and a select line segment s1s0, which transmit the reset signal r0 and the select signal s0, respectively, to pixels 10-17 of row R0. Note that reset line segment r1s0 and select line segment s1s0 are connected to row reset line segment rr00 and row select line segment rs00 within layout 400, thereby providing the sole difference between layout 400 and layout 300. The via connections responsible for this difference are illustrated as circles filled with an 'X' in FIGS. 1 and 4. Within pixel array 105, pixels 10, 21, 32, 43, 54, 65, 76, 87 (i.e., pixels on a diagonal of the pixel array 105) have the same layout 400.

Providing a substantially identical layout for all of the pixels of array 105 advantageously facilitates the stitching of large pixel arrays on image sensor die 100. That is, pixel array 105 can be fabricated using a stitching scheme which replicates identical sub-arrays of pixels across the wafer, wherein the sub-arrays combine to form the full array 105. During the actual production process, vias are formed in some of the sub-arrays to connect the pixel array 105 to the control circuitry 103 in the manner described above. The formation of vias is not required (or performed) in other sub-arrays. For example, the pixel array 105 of FIG. 1 may include four sub-arrays, wherein a first sub-array includes pixels 10-13, 20-23, 30-33 and 40-43; a second sub-array includes pixels 14-17, 24-27, 34-37 and 44-47; a third sub-array includes pixels 50-53, 60-63, 70-73 and 80-83, and a fourth sub-array includes pixels 54-57, 64-67, 74-77 and 84-87. In this example, vias used to connect the various rows to the row driver circuitry 104 are formed in the first and fourth sub-arrays, but not in the second and third sub-arrays. That is, the via forming step is skipped in the second and third sub-arrays Moreover, the use of substantially identical layouts 300 and 400 result in consistent pixel spacing (pitch) across the entire pixel array 105.

In accordance with another embodiment of the present invention, the layout of the photodiode region of each pixel is symmetrical through a central vertical axis of the pixel layout. The central vertical axes of pixel layouts 300 and 400 are labeled "CVA" in FIGS. 3 and 4. Providing a symmetrical photodiode layout as illustrated in FIGS. 3 and 4 allows all of the photodiodes of pixel array 105 to have mirror-image symmetry about a central vertical axis 102 of the CMOS image sensor die 100 (FIG. 1). As described in more detail below, this symmetry may result in improved pixel alignment across multiple tiled CMOS image sensor dies.

Figure 5:
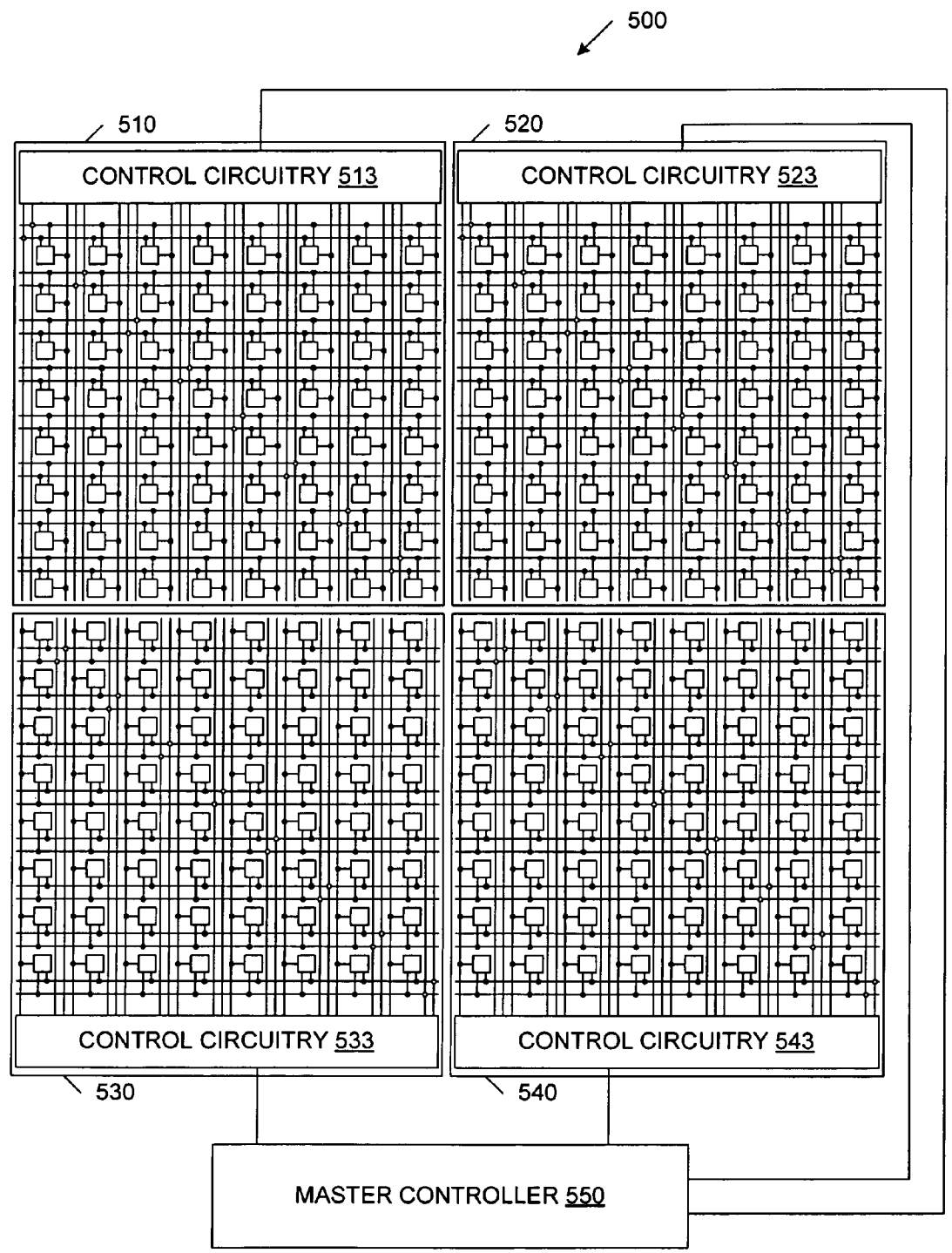
FIG. 5 is a block diagram of a CMOS image sensor system, which includes multiple CMOS image sensor dies tiled in a 2×2 array, in accordance with one embodiment of the present invention.

FIG. 5 is a block diagram of a CMOS image sensor system 500, which includes multiple CMOS image sensor dies 510, 520, 530 and 540, and master controller 550. CMOS image sensor dies 510, 520, 530 and 540 are tiled in a 2×2 array to form a large CMOS image sensor. In the example illustrated by FIG. 5, each of the CMOS image sensor dies 510, 520, 530 and 540 is identical to CMOS image sensor die 100 (FIG. 1).

CMOS image sensor dies 510, 520, 530 and 540 are tiled by affixing these dies on a common substrate, such that the edges of the dies abut one another. When tiled in this manner, the pixel rows $R_N$ of CMOS image sensor die 510 are vertically aligned with the corresponding pixel rows $R_N$ of CMOS image sensor die 520. Similarly, the pixel rows $R_N$ of CMOS image sensor die 530 are vertically aligned with the corresponding pixel rows $R_N$ of CMOS image sensor die 540.

In accordance with one embodiment, the pixel columns $C_M$ of CMOS image sensor die 510 are horizontally aligned with the corresponding pixel columns $C_M$ of CMOS image sensor die 530. Similarly, the pixel columns $C_M$ of CMOS image sensor die 520 are horizontally aligned with the corresponding pixel columns $C_M$ of CMOS image sensor die 540. Note that the symmetry of the CMOS image sensor dies 510, 520, 530 and 540 about their central vertical axes promotes this column alignment.

Master controller 550 is coupled to the control circuitry 513, 523, 533 and 543 present in the CMOS image sensor dies 510, 520, 530 and 540, respectively. Master controller 550 may cause these control circuits 513, 523, 533 and 543 to access their corresponding pixel arrays in various manners. For example, master controller 550 may first cause control circuitry 513 and 523 to sequentially access rows R0-R7 of their associated pixel arrays, with the corresponding rows of these pixel arrays being accessed simultaneously. That is, master controller 550 may cause each of the control circuits 513 and 523 to simultaneously access row $R_N$ of their respective pixel arrays, wherein N starts at a value of '0' and sequentially increases to a value of '7'. By simultaneously accessing row $R_N$ in both of CMOS image sensor dies 510 and 520, master controller 550 effectively accesses a 'row' that extends across the entire tiled CMOS image sensor structure.

After all of the pixel rows in CMOS image sensor dies 510 and 520 have been accessed, master controller 550 may then cause the control circuitry 533 and 543 of CMOS image sensor dies 530 and 540 to sequentially access rows R7-R0 of the associated pixel arrays, with the corresponding rows of these pixel arrays being accessed simultaneously. Operating in this manner, master controller 550 will sequentially access each entire row of the tiled CMOS image sensor structure, starting from the uppermost pixel row in CMOS image sensor dies 510 and 520, and ending with the lowermost pixel row in CMOS image sensor dies 530 and 540. Master controller 550 may be configured to perform pixel interpolation if gaps between the abutting CMOS image sensor dies 510, 520, 530 and 540 are large enough to result in 'missing' pixels within the CMOS image sensor structure 500.

In another embodiment of the present invention, master controller 550 may enable simultaneous accesses in CMOS image sensor dies 510, 520, 530 and 540. For example, master controller 510 may enable accesses to CMOS image sensor dies 501-502 at the same time as accesses to CMOS image sensor dies 503-504.

Figure 6:
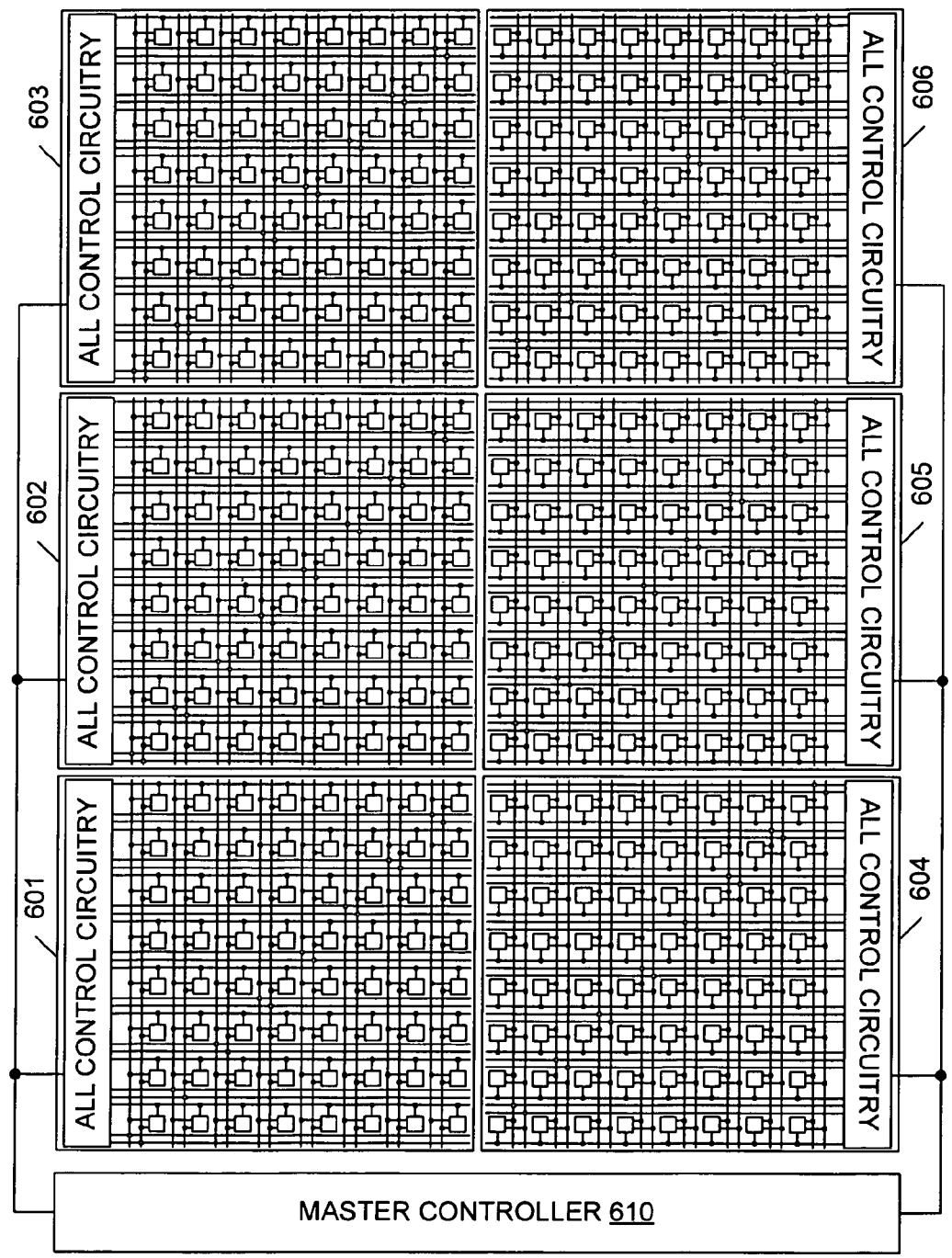
FIG. 6 is a block diagram of a CMOS image sensor system, which includes multiple CMOS image sensor dies tiled in a 2×3 array, in accordance with one embodiment of the present invention.

FIG. 6 is a block diagram of a CMOS image sensor system 600, which includes multiple CMOS image sensor dies 601-606 and master controller 610. CMOS image sensor dies 601-606 are tiled in a 2×3 array to form a large CMOS image sensor. In the example illustrated by FIG. 6, each of the CMOS image sensor dies 601-606 is identical to CMOS image sensor die 100 (FIG. 1). Master controller 610 is coupled to the control circuitry of CMOS image sensor dies 601-606. Master controller 610 controls accesses to the pixel arrays of CMOS image sensor dies 601-606 in the manner described above in connection with FIG. 5. CMOS image sensor system 600 is provided to illustrate the manner in which CMOS image sensor dies of the present invention can be tiled to form a 2×N array, wherein N is any integer greater than or equal to 1.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. An image sensor comprising:
a semiconductor die having a plurality of peripheral edges;
a pixel array comprising a plurality of pixels arranged in rows and columns on the semiconductor die, wherein the pixel array extends to locations adjacent to three peripheral edges of the semiconductor die;
a plurality of pixel signal lines, each extending along a corresponding column of the pixel array, wherein each of the columns of pixels of the pixel array is coupled to a corresponding one of the pixel signal lines;
a plurality of select lines, each extending along a corresponding row of the pixel array, wherein each of the rows of pixels of the pixel array is coupled to a corresponding one of the select lines, and wherein each of the pixels has an identical layout, including the pixel signal lines and the select lines; and
control circuitry fabricated on the semiconductor die and configured to access the pixels of the pixel array, wherein the control circuitry is located along a fourth peripheral edge of the semiconductor die, and wherein none of the control circuitry is located within the pixel array, wherein the pixel array comprises a first set of pixel sub-arrays that include vias to connect the select lines to the control circuitry, and a second set of pixel arrays that do not include vias to connect the select lines to the control circuitry.

2. The image sensor of claim 1, wherein the semiconductor die is rectangular, with four peripheral edges.

3. The image sensor of claim 1, wherein the rows and columns include a first column located adjacent to a first peripheral edge of the semiconductor die, a second column located adjacent to a second peripheral edge of the semiconductor die, and a first row located adjacent to a third peripheral edge of the semiconductor die.

4. The image sensor of claim 3, wherein the rows and columns further comprise a second row located adjacent to the control circuitry.

5. The image sensor of claim 1, wherein the pixels exhibit a consistent pitch across the entire pixel array.

6. The image sensor of claim 1, wherein the spacing between adjacent pixels in the pixel array is consistent across the entire pixel array.

7. The image sensor of claim 1, wherein the pixels of the pixel array have a symmetric arrangement with respect to a central axis of the die.

8. The image sensor of claim 1, wherein the control circuitry includes a row driver that generates signals to access the pixel array on a row-by-row basis.

9. The image sensor of claim 1, wherein the control circuitry includes a row driver that generates a dedicated select signal for each row of the pixel array.

10. The image sensor of claim 1, wherein the pixel array comprises a plurality of CMOS pixels fabricated on the semiconductor die.

11. An image sensor comprising:
a plurality of image sensor structures tiled in a pattern having a first row, an adjacent second row, and a plurality of columns, wherein each of the image sensor structures includes:
a semiconductor die having a plurality of peripheral edges;
a pixel array comprising a plurality of pixels fabricated on the semiconductor die, wherein the pixel array extends to locations adjacent to three peripheral edges of the semiconductor die, wherein the pixel array comprises a first set of pixel sub-arrays, each including a first pattern of vias, and a second set of pixel sub-arrays, each including a second pattern of vias, different than the first pattern of vias;

conductive interconnect circuitry coupled to the pixels of the pixel array, wherein each of the pixels has an identical layout, including the conductive interconnect circuitry; and control circuitry fabricated on the semiconductor die and configured to access the pixels of the pixel array, wherein the control circuitry is located along a fourth peripheral edge of the semiconductor die, and wherein none of the control circuitry is located within the pixel array, and wherein pixel arrays of the image sensor structures in the first row are located immediately adjacent to the pixel arrays of the image sensor structures in the second row.

12. The image sensor of claim 11, wherein pixel arrays of the image sensor structures in the first row are located immediately adjacent to one another, and pixel arrays of the image sensor structures in the second row are located immediately adjacent to one another.

13. The image sensor of claim 11, wherein the control circuitry of the image sensor structures in the first row are located along a top edge of the first row, and wherein the control circuitry of the image sensor structures in the second row are located along a bottom edge of the second row.

14. The image sensor of claim 11, further comprising a master control circuit coupled to the control circuitry of each of the image sensor structures, wherein the master control circuit controls the control circuitry of each of the image sensor structures.

15. The image sensor of claim 11, wherein the pixel array comprises a plurality of CMOS pixels fabricated on the semiconductor die.

16. A method of fabricating an image sensor, comprising:
fabricating a CMOS pixel array having a plurality of CMOS pixels on a semiconductor die, such that the CMOS pixel array extends to three peripheral edges of the semiconductor die, wherein the step of fabricating the CMOS pixel array comprises stitching a plurality of CMOS pixel sub-arrays on the semiconductor die, and performing a via forming step in the fabrication of a first set of the CMOS pixel sub-arrays, but not performing the same via forming step in the fabrication of a second set of the CMOS pixel sub-arrays;

fabricating control circuitry for accessing the CMOS pixels of the CMOS pixel array on the semiconductor die, wherein the control circuitry is fabricated substantially along a fourth peripheral edge of the semiconductor die, such that none of the control circuitry is fabricated in the CMOS pixel array.

* * * * *